US008643449B2

(12) United States Patent
Kim et al.

(10) Patent No.: US 8,643,449 B2
(45) Date of Patent: Feb. 4, 2014

(54) IMPEDANCE MATCHING CIRCUIT CAPABLE OF EFFICIENTLY ISOLATING PATHS FOR MULTI-BAND POWER AMPLIFIER

(75) Inventors: Jung Hyun Kim, Seoul (KR); Un Ha Kim, Seoul (KR); Sang Hwa Jung, Ansan (KR); Young Kwon, Thousand Oaks, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 984 days.

(21) Appl. No.: 12/732,409

(22) Filed: Mar. 26, 2010

(65) Prior Publication Data
US 2011/0234316 A1 Sep. 29, 2011

(51) Int. Cl.
*H03H 7/38* (2006.01)
(52) U.S. Cl.
USPC .............................. 333/124; 333/32
(58) Field of Classification Search
USPC .................... 333/32, 17.3, 124, 125
See application file for complete search history.

(56) References Cited

U.S. PATENT DOCUMENTS

| 5,969,582 | A | 10/1999 | Boesch et al. |
| 6,091,966 | A | 7/2000 | Meadows |
| 6,188,877 | B1 | 2/2001 | Boesch et al. |
| 6,501,331 | B2 | 12/2002 | Adar |
| 6,621,376 | B2 | 9/2003 | Liu et al. |
| 6,900,692 | B2 | 5/2005 | Kim et al. |
| 7,567,129 | B2 | 7/2009 | Rohani et al. |
| 2005/0068101 | A1 | 3/2005 | Kim et al. |
| 2005/0083117 | A1 | 4/2005 | Kim et al. |
| 2005/0099227 | A1 | 5/2005 | Kim et al. |
| 2005/0122165 | A1 | 6/2005 | Kim et al. |
| 2008/0290947 | A1 | 11/2008 | Dawe |
| 2009/0045877 | A1 | 2/2009 | Wang et al. |
| 2009/0180403 | A1 | 7/2009 | Tudosoiu |

OTHER PUBLICATIONS

Zhang, et al. "A Novel Reconfigurable Power Amplifier Structure for Multi-Band and Multi-Mode Portable Wireless Applications using a Reconfigurable Die and a Switchable Output Matching Network", Microwave Symposium Digest 2009, IEEE MTT-S International, p. 913-916, Jun. 7-12, 2009.

*Primary Examiner* — Stephen Jones

(57) ABSTRACT

In accordance with a representative embodiment, an impedance matching circuit for use at an output stage of a power amplifier is disclosed. The impedance matching circuit comprises: an input port for receiving a frequency band signal; and a plurality of paths, each path being allocated with a principal band signal to be transmitted therethrough and including a path on-off network and a fixed-value impedance matching network. Depending on a type of the received frequency band signal, the path on-off network is configured to activate a selected one of the plurality of paths by rendering an input impedance of the selected path to have a lower absolute magnitude so that the signal is transmitted therethrough, and to deactivate the remaining paths of the plurality of paths by rendering the input impedance thereof to have a higher absolute magnitude so that the signal is not transmitted therethrough. The fixed-value impedance matching network matches a load impedance of the output port of each path to the input impedance thereof, thereby rendering the input impedance thereof to have a prescribed reference value with respect to the principal band signal when said path is activated by the path on-off network.

21 Claims, 11 Drawing Sheets

•••• PRINCIPAL BAND SIGNAL (SWITCH (718) OFF)
—— ALTERNATIVE POWER LEVEL SIGNAL (SWITCH (718) ON)

•••• PRINCIPAL BAND SIGNAL (SWITCH (918) OFF)
—— ALTERNATIVE POWER LEVEL SIGNAL (SWITCH (918) ON)

FIG. 11B

| SWITCH (1151) | SWITCH (1141) | SWITCH (1153) | SWITCH (1143) | SWITCH (1155) | SWITCH (1145) | SELECTED OUTPUT PORT AND TYPE OF FREQUENCY BAND SIGNAL | ETC |
|---|---|---|---|---|---|---|---|
| OFF | OFF | OFF | ON | OFF | ON | OUTPUT (1120), BAND2 | PRINCIPAL BAND SIGNAL |
| ON | OFF | OFF | ON | OFF | ON | OUTPUT (1120), BAND1 | ALTERNATIVE POWER LEVEL SIGNAL |
| OFF | ON | OFF | OFF | OFF | ON | OUTPUT (1122), BAND1 | PRINCIPAL BAND SIGNAL |
| OFF | ON | ON | OFF | OFF | ON | OUTPUT (1122), BAND4,10 | ALTERNATIVE POWER LEVEL SIGNAL |
| OFF | ON | OFF | ON | OFF | OFF | OUTPUT (1124), PCS1900 | PRINCIPAL BAND SIGNAL |
| OFF | ON | OFF | ON | ON | OFF | OUTPUT (1124), DCS 1800 | ALTERNATIVE POWER LEVEL SIGNAL |

IMPEDANCE MATCHING CIRCUIT CAPABLE OF EFFICIENTLY ISOLATING PATHS FOR MULTI-BAND POWER AMPLIFIER

BACKGROUND

In a wireless communications system using a mobile terminal, several types of frequency band signals may be employed having various transmission frequency bands and requiring different transmission power levels.

For example, in case of Universal Mobile Telecommunication System (UMTS) which is one of the third generation standards, there are a variety of subdivided frequency bands such as BAND 1 (transmission frequency band: 1920-1980 MHz) being used in most countries except the U.S.A, BAND 2 (transmission frequency band: 1850-1910 MHz) being used in North and South America, BAND 4, 10 (transmission frequency band: 1710-1770 MHz) being used in some parts of the U.S.A. and Canada, BAND 5 (transmission frequency band: 824-849 MHz) being used in certain parts of the U.S.A and Oceania and BAND 8 (transmission frequency band: 880-915 MHz) being used in Europe, Asia and Oceania. Furthermore, with respect to Global System for Mobile communication (GSM) which is one of the second generation communication standards, there are also a variety of subdivided frequency bands such as GSM 900 (transmission frequency band: 880-915 MHz) and DCS 1800 (transmission frequency band: 1710-1785 MHz) being used in most countries which have adopted GSM; and GSM 850 (transmission frequency band: 824-849 MHz) and PCS 1900 (transmission frequency band: 1850-1910 MHz) being used in some countries including the U.S.A. and Canada.

With the rising need for global roaming services, the demand for roaming services without having to change the mobile terminal has also risen. In efforts to meet the demand, it has become useful to provide a transmission circuit in a mobile terminal that is capable of selectively transmitting a signal in a desired frequency band at a suitable power level. For example, when a user is located in a first region where a first frequency band signal is used for a mobile communications system, the power amplifier circuit of the user's mobile terminal should be able to output the first frequency band signal at a first power level suitable for the region. Similarly, when the user moves to a second region where a second frequency band signal is used for a mobile communications system, the power amplifier circuit should be capable of outputting the second frequency band signal at a second power level suitable for the second region.

Known attempts to provide suitable power levels in different regions and at different frequency bands have certain drawbacks. For example, in one known power amplifier circuit is structured to have two power amplifier cores, each of which consists of a plurality of amplifiers selectively used depending on a type of the frequency band signal to be transmitted; and also to have impedance matching circuits provided at input, intermediate and output stages of the respective amplifier cores. Thus, as the variety of types of frequency band signals for transmission increases, the structure of the power amplifier circuit becomes more complicated, thereby increasing the size and manufacturing cost thereof.

Another known attempt to provide suitable power levels in different regions and at different frequency bands provides isolation between output ports using the parallel resonance circuits. This provides sufficient isolation only when there is a sufficiently large frequency difference between the two types of frequency band signals. If the frequency band signals having a comparatively small frequency difference (e.g., BAND 1 and BAND 2 signals), an effective filtering or isolation between the two paths may not be attained since the characteristics of these two frequency band signals are similar.

Moreover, when three or more types of frequency band signals need be transmitted selectively, the number of output ports of the circuit must be further increased. However, since only one of the output ports may be used to selectively transmit one type of frequency band signals at a time, the number of idle output ports will be concomitantly increased, thereby lowering the efficiency thereof.

What is needed, therefore, is a multi-band power amplifier that overcomes at least the deficiencies of known amplifiers discussed above.

SUMMARY

In accordance with a representative embodiment, an impedance matching circuit for use at an output stage of a power amplifier is disclosed. The impedance matching circuit comprises: an input port for receiving a frequency band signal; and a plurality of paths, each path being allocated with a principal band signal to be transmitted therethrough and including a path on-off network and a fixed-value impedance matching network. Depending on a type of the received frequency band signal, the path on-off network is configured to activate a selected one of the plurality of paths by rendering an input impedance of the selected path to have a lower absolute magnitude so that the signal is transmitted therethrough, and to deactivate the remaining paths of the plurality of paths by rendering the input impedance thereof to have a higher absolute magnitude so that the signal is not transmitted therethrough. The fixed-value impedance matching network matches a load impedance of the output port of each path to the input impedance thereof, thereby rendering the input impedance thereof to have a prescribed reference value with respect to the principal band signal when said path is activated by the path on-off network.

In accordance with another representative embodiment, an impedance matching circuit for use at an output stage of a power amplifier is disclosed. The impedance matching circuit comprises: an input port configured to receive a frequency band signal; and a path, comprising a fixed-value impedance matching network and a frequency reconfiguration network, and configured to selectively transmit a principal band signal or an alternative band signal depending on a type of the received frequency band signal, the alternative band signal having a frequency band lower than that of the principal band signal and having a prescribed output power level substantially equal to that of the principal band signal. When the type of the received frequency band signal is the substantially same as that of the principal band signal, the fixed-value impedance matching network matches a load impedance of the path to an input impedance of the path, thereby rendering the input impedance to have a prescribed reference value, and when the type of the received frequency band signal is substantially the same as that of the alternative band signal, the fixed-value impedance matching network along with the frequency reconfiguration network renders the input impedance to have a value substantially equal to the prescribed reference value so that the received signal is transmitted therethrough at the prescribed output power level.

In accordance another representative embodiment, an impedance matching circuit for use at an output stage of a power amplifier is disclosed. The impedance matching circuit comprises: an input port configured to receive a frequency band signal; and a path, comprising a fixed-value impedance matching network and an output power reconfiguration network, and configured to selectively transmit a principal band signal or an alternative power level signal depending on a type of the received frequency band signal, the alternative power level signal having a frequency band substantially equal to that of the principal band signal and having an output power level lower than that of the principal band signal. When the type of the received frequency band signal is substantially the same as that of the principal band signal, the fixed-value impedance matching network matches a load impedance of the path to an input impedance of the path, thereby rendering the input impedance to have a prescribed reference value. When the type of the received frequency band signal is substantially the same as that of the alternative power level signal, the fixed-value impedance matching network along with the output power reconfiguration network renders the input impedance to have a value greater than the prescribed reference value so that the received signal is transmitted therethrough at the desired output power level.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 11B shows a table of the selected output ports and types of frequency band signals depending on the ON/OFF operations of RF switches in the circuit shown in FIG. 11A.

DETAILED DESCRIPTION OF THE PREFERRED EMBODIMENTS

In the following detailed description, for purposes of explanation and not limitation, representative embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 1:
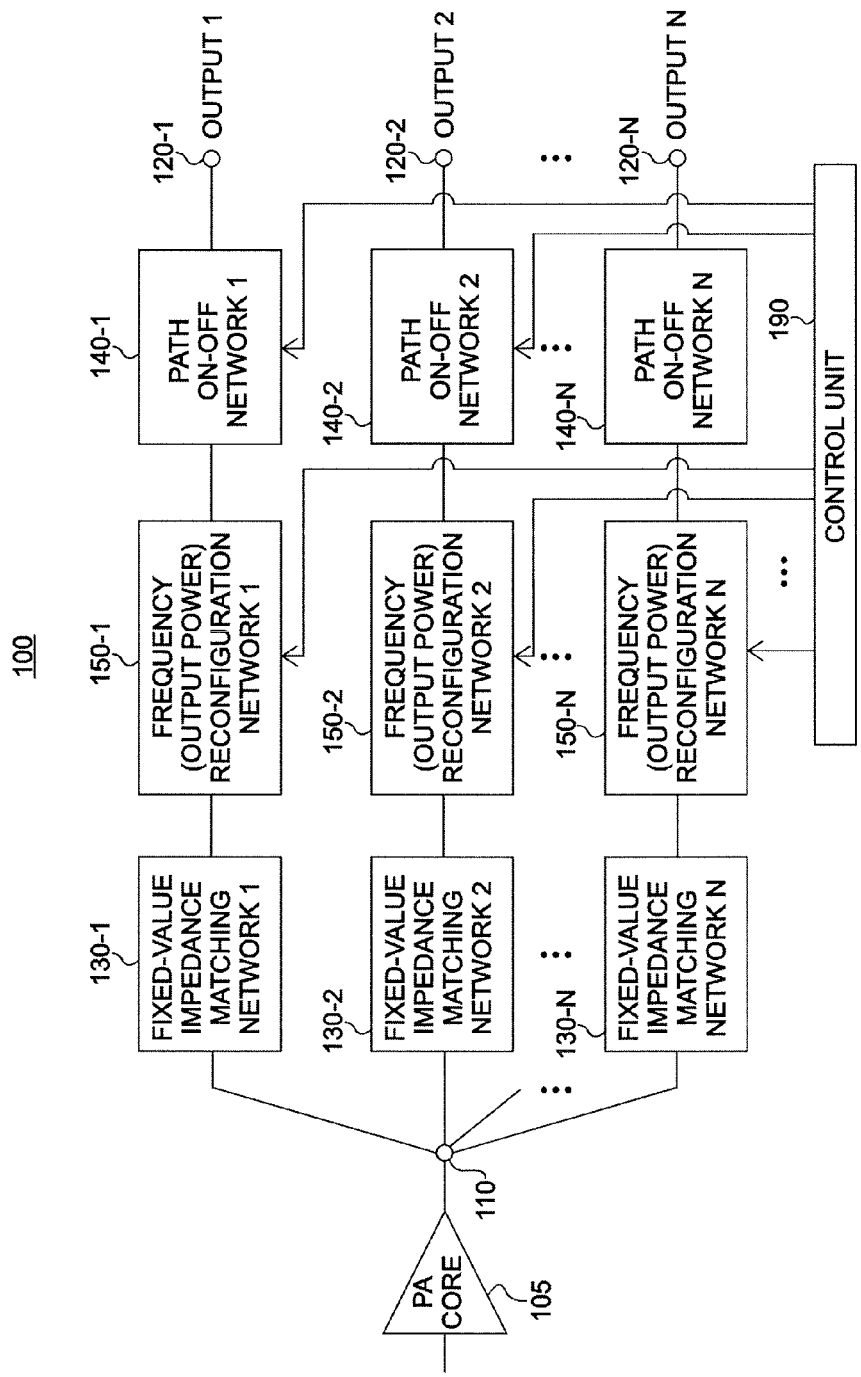
FIG. 1 is a conceptual block diagram of an impedance matching circuit in accordance with a representative embodiment.

FIG. 1 is a conceptual block diagram of an impedance matching circuit in accordance with a representative embodiment.

A multi-band power amplifier capable of selectively outputting one of multiple types of frequency band signals includes a power amplifier core 105 for amplifying the signals and an impedance matching circuit 100 connected to an output port of the power amplifier core 105 and configured to match output load impedances of the impedance matching circuit 100 to a load impedance of the power amplifier core 105.

All of the frequency band signals outputted from the multi-band power amplifier may be limited to high frequency band signals having center frequencies in the range of about 1.4 GHz to 2.5 GHz, or to low frequency band signals having center frequencies in the range of about 0.7 GHz to 0.9 GHz. When the frequency band signals outputted from the power amplifier core 105 have relatively similar frequency bands by limiting all of the frequency band signals to high frequency band signals or low frequency band signals, it would not be necessary to provide impedance matching circuits which are reconfiguration depending on the frequencies of input frequency band signals at the input and interstage of the power amplifier core 105.

The power amplifier core 105, which may be a high-band power amplifier or a low-band power amplifier, includes an input port for receiving a frequency band signal and an output port for outputting the frequency band signal. The power amplifier core 105 transmits the amplified frequency band signal to the impedance matching circuit 100. The impedance matching circuit 100 includes an input port 110 for receiving the frequency band signal from the power amplifier core 105, a plurality of paths and a control unit 190.

One end of each path is connected to the input port 110 and the other end thereof has an output port 120-1, 120-2, . . . , or 120-N, for outputting the signal. Each path can transmit one or more types of frequency band signals through the output port thereof (e.g., 120-1), and a principal band signal which is one of the frequency band signals to be transmitted through each path is allocated to each path. Each path may be further allocated with an alternative band signal and/or an alternative power level signal. The alternative band signal has a prescribed output power level substantially equal to that of the principal band signal. The alternative power level signal has a frequency band substantially equal to that of the principal band signal and has a desired output power level lower than that of the principal band signal.

Each path may include a path on-off network (e.g., 140-1), a fixed-value impedance matching network (e.g., 130-1) and a frequency reconfiguration network (e.g., 150-1).

Each fixed-value impedance matching network 130-1, 130-2, ..., or 130-N is connected to the input port 110; and one end of the path on-off network (e.g., 140-1) of each path, ..., is connected to the fixed-value impedance matching network of each path (e.g., 130-1) and the other end thereof is connected to the output port of each path (e.g., 120-1).

The frequency reconfiguration network of each path (e.g., 150-1) is connected between the fixed-value impedance matching network (e.g., 130-1) and the path on-off network (e.g., 140-1) of each path.

The path on-off network 140-1, 140-2, ..., or 140-N, depending on the type of the received frequency band signal, may deactivate each path by rendering an input impedance of each path to have a higher absolute magnitude so that the signal is not transmitted through each path or activate each path by rendering the input impedance of each path to have a lower absolute magnitude so that the signal is transmitted through each path.

The fixed-value impedance matching network (e.g., 130-1), when each path is activated by the path on-off network (e.g., 140-1) and the type of the received frequency band signal is the same as that of the principal band signal of each path, matches the load impedance of each path to the input impedance of each path, thereby rendering the input impedance of each path to have a reference value predetermined with respect to the principal band signal of each path.

The control unit 190, depending on the type of the received frequency band signal, controls the path on-off network 140-1, 140-2, ..., or 140-N to activate one of the paths and to deactivate the remaining paths.

The control unit 190, also enables or disables the frequency reconfiguration network 150-1, 150-2, ..., or 150-N and the output power reconfiguration network 150-1, 150-2, ..., or 150-N depending on the type of the received frequency band signal. The control unit 190, when one of the paths is activated by the path on-off network thereof 140-1, 140-2, ..., or 140-N and the type of the received frequency band signal is the same as that of the principal band signal of one path, disables the frequency reconfiguration network 150-1, 150-2, ..., or 150-N of one path and, when the one path is activated by the path on-off network 140-1, 140-2, ..., or 140-N and the type of the received frequency band signal is the same as that of the alternative band signal of the one path, enables the frequency reconfiguration network 150-1, 150-2, ..., or 150-N.

The frequency reconfiguration network 150-1, 150-2, ..., or 150-N along with the fixed-value impedance matching network 130-1, 130-2, ..., or 130-N, when it is enabled by the control unit 190, renders the input impedance of each path substantially equal to the reference value of said each path so that the received signal is transmitted at the prescribed output power level of the alternative band signal of each path.

The frequency reconfiguration network 150-1, 150-2, ..., or 150-N may be replaced with an output power reconfiguration network 150-1, 150-2, ..., or 150-N.

The control unit 190, when one of the paths is activated by the path on-off network thereof 140-1, 140-2, ..., or 140-N and the type of the received frequency band signal is the same as that of the principal band signal of the one path, disables the output power reconfiguration network 150-1, 150-2, ..., or 150-N and, when the one path is activated by the path on-off network thereof 140-1, 140-2, ..., or 140-N and the type of the received frequency band signal is the same as that of the alternative power level signal of the one path, enables the output power reconfiguration network thereof 150-1, 150-2, ..., or 150-N.

The output power reconfiguration network (e.g., 150-1) along with the fixed-value impedance matching network (e.g., 130-1), when it is enabled by the control unit 190, renders the input impedance of the relevant path to have a value greater than the reference value of the path so that the received signal is transmitted at a desired output power level of the alternative power level signal of each path.

The applications of the impedance matching circuit in accordance with the the present teachings will now be described with reference to the block diagrams of FIGS. 2 to 4.

Figure 2:
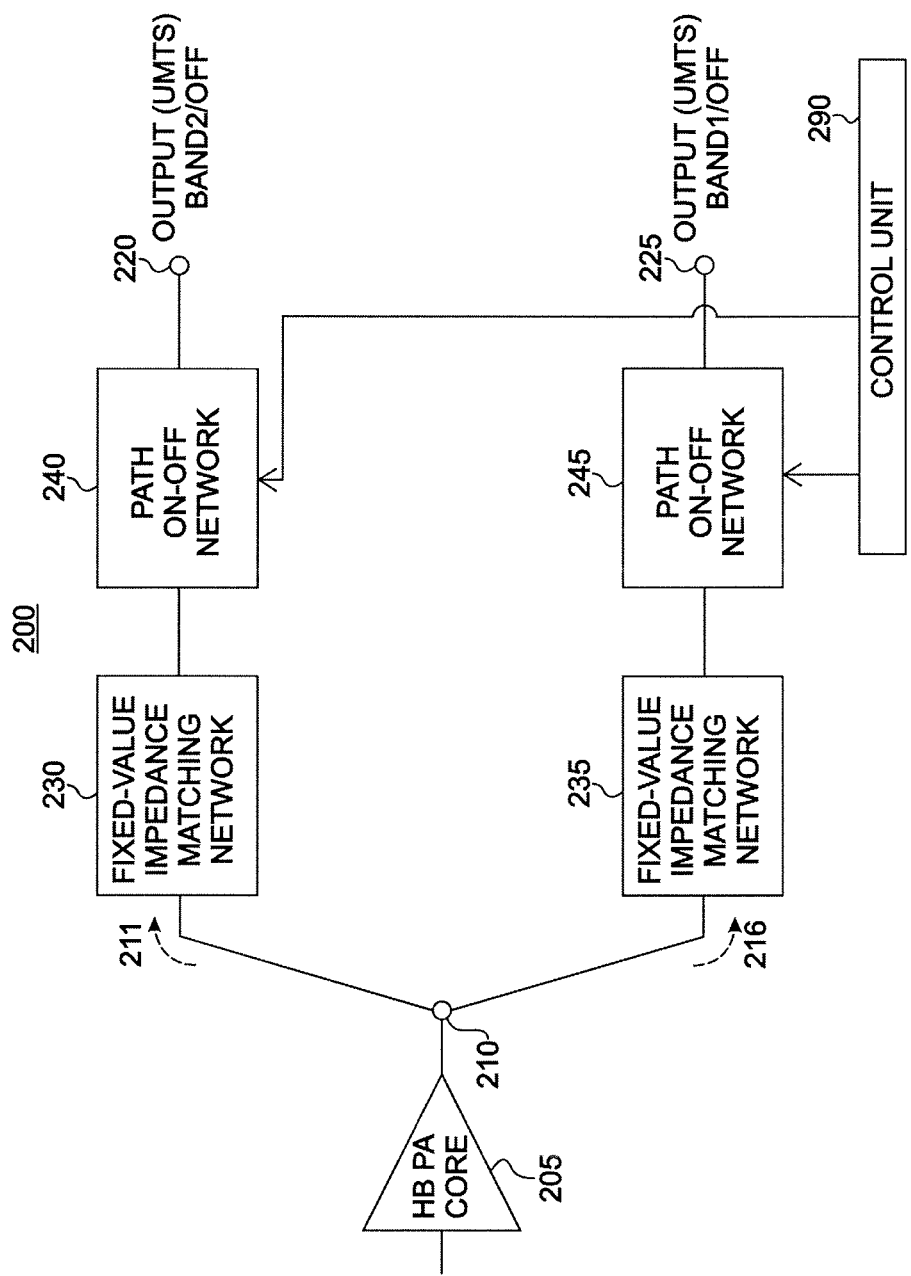
FIG. 2 shows a simplified block diagram of an impedance matching circuit used for a high frequency multi-band power amplifier, which outputs only high frequency signals, in accordance with a representative embodiment.

FIG. 2 shows a block diagram of an impedance matching circuit used for a high frequency multi-band power amplifier, which outputs only high frequency signals.

The high frequency multi-band power amplifier capable of outputting a plurality of high frequency band signals includes a high frequency power amplifier core 205 for amplifying input signals and an impedance matching circuit 200 connected to an output port of the high frequency power amplifier core 205 and configured to match a load impedance of the impedance matching circuit to an output impedance of the high frequency power amplifier core 205.

The impedance matching circuit 200 shown in FIG. 2 includes an input port 210 for receiving a high frequency band signal, paths 211, 216 having output ports 220, 225, respectively, and a control unit 290.

Each of the paths 211, 216 includes a fixed-value impedance matching network 230 or 235 and a path on-off network 240 or 245 and is allocated with UMTS BAND 2 signal or UMTS BAND 1 signal as a principal band signal, thereby being capable of transmitting UMTS BAND 2 signal or UMTS BAND 1 signal through the path 211 or 216.

The path on-off network (e.g., 240), depending on a type of the received high frequency band signal, may activate the path (e.g., 211) so that the signal is transmitted through the path or deactivate the path so that the signal is prevented from being transmitted through the path 211.

If an isolation is not sufficiently provided between the activated and the deactivated paths, a load impedance of the power amplifier core 205 may vary with input impedances of the paths 211, 216, which may cause a leakage of the outputting signal through an undesired output port, thereby deteriorating the efficiency and reducing the signal reception sensitivity. In order to prevent these problems, an effective isolation of, e.g., 30 dB or more, between the paths 211, 216 is required.

For example, in case the control unit 290 activates the path on-off network 240 and deactivates the path on-off network 245, the output power level of, e.g., a BAND 2 signal leaking through the deactivated path 216 must be at least 30 dB lower than that of the BAND 2 signal transmitted through the activated path 211. In this connection, if the input impedance of the path 216 deactivated by the path on-off network 245 has an absolute magnitude of at least ten times that of the path 211 activated by the path on-off network 240, an effective isolation of 30 dB or more between the paths 211, 216 could be attained.

Further, the fixed-value impedance matching network 230 or 235, if the path 211 or 216 is activated by the path on-off network 240 or 245, and the type of the received frequency band signal is the same as that of the principal band signal, matches a load impedance of the output port of the path 211 or 216 to an input impedance of the path 211 or 216.

The control unit 290 controls the path on-off network 240 or 245 to activate the path 211 or 216 or deactivate the path 211 or 216 depending on the type of the received high frequency band signal.

Figure 3:
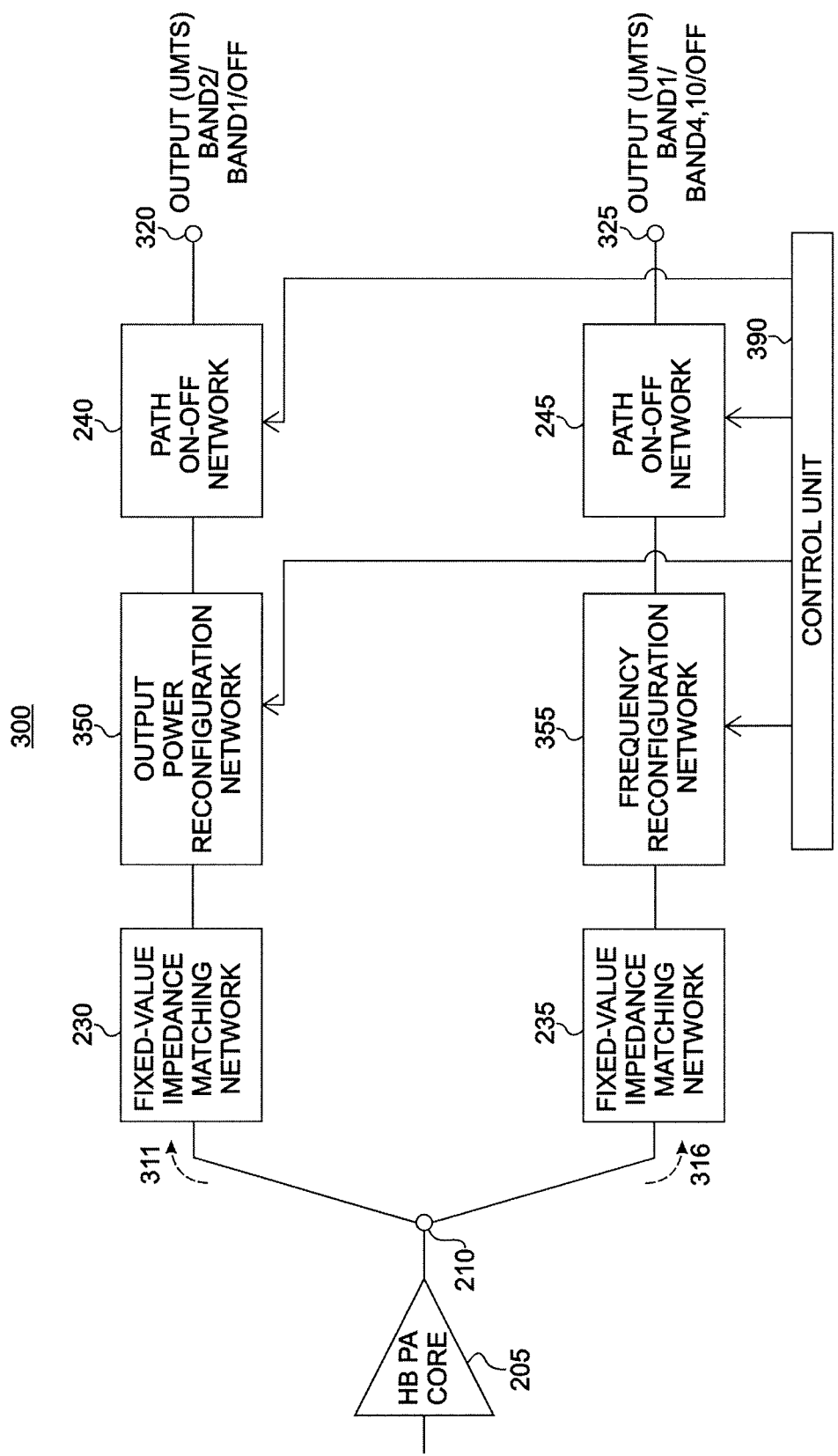
FIG. 3 shows a simplified block diagram of an impedance matching circuit including an output power reconfiguration network and a frequency reconfiguration network, accordance with a representative embodiment.

FIG. 3 presents a block diagram of an impedance matching circuit including an output power reconfiguration network and a frequency reconfiguration network.

A power amplifier shown in FIG. 3 is the same as that shown in FIG. 2 except that one path 311 includes an output power reconfiguration network 350, thereby being further allocated with a BAND 1 signal as an alternative power level signal thereof and another path 316 includes a frequency reconfiguration network 355, thereby being further allocated with a BAND 4, 10 signal as an alternative band signal.

The operations of the fixed-value impedance matching networks 230, 235 and the path on-off networks 240, 245 included in the impedance matching circuit 300 of FIG. 3 are the same as that described with reference to FIG. 2 and the operation of the control unit 390 is the same as that described with reference to FIG. 1.

Using the output power reconfiguration network 350, one of a principal band signal, e.g., a UMTS BAND 2 signal, and an alternative power level signal, e.g., a BAND 1 signal, can be selectively transmitted through the path 311. Similarly, using the frequency reconfiguration network 355, one of a principal band signal, e.g., a UMTS BAND 1 signal, and an alternative band signal, e.g., a BAND 4, 10 signal, can be selectively transmitted through the path 316.

The path 316 may be allocated with a Personal Communication System (PCS) 1900 and a GSM Digital Communication System (DCS) 1800 signals as the principal band signal and the alternative band signal, respectively.

Figure 4:
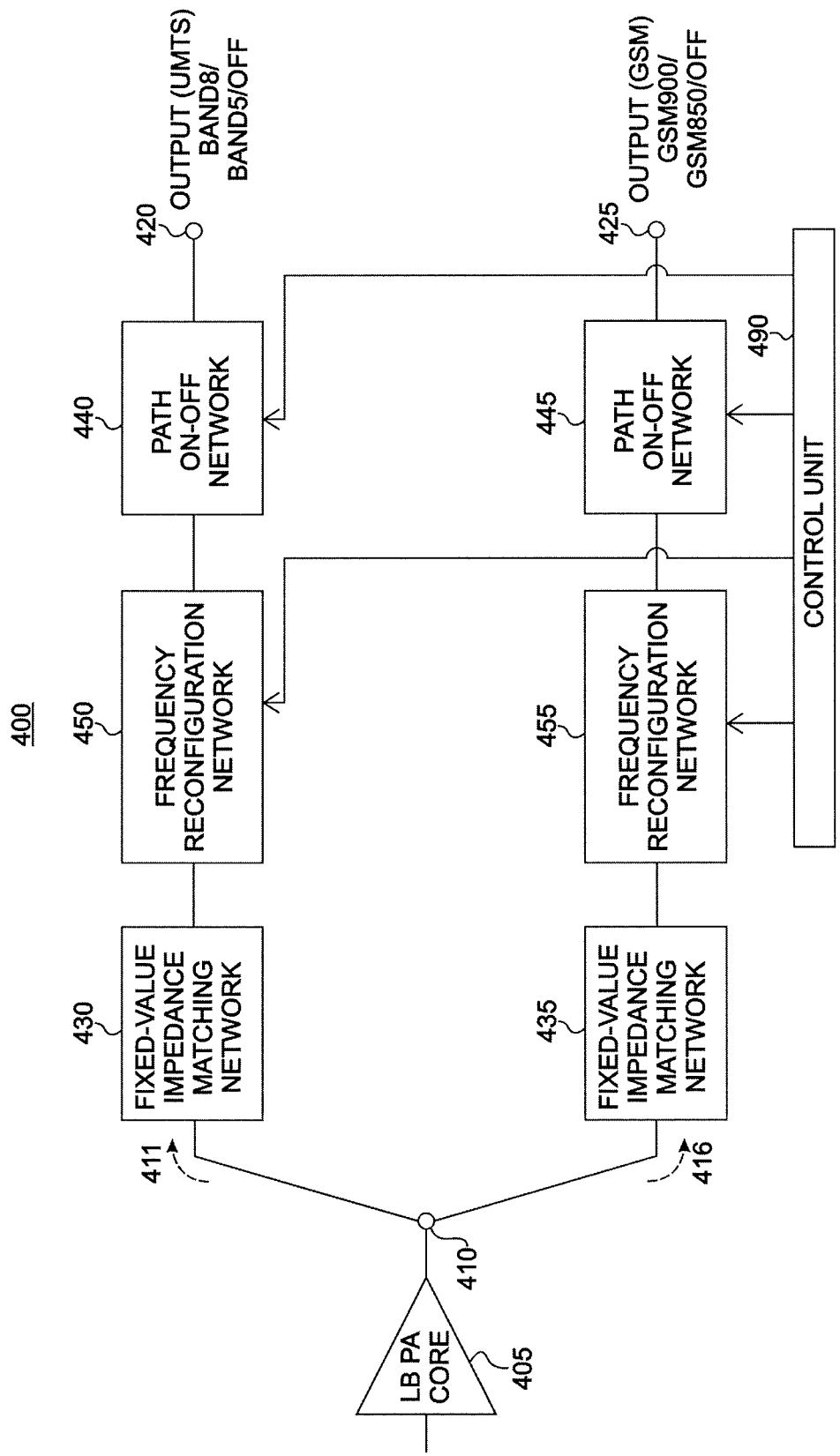
FIG. 4 depicts a simplified block diagram of an impedance matching circuit for a low frequency multi-band power amplifier, which outputs only low frequency signals, in accordance with a representative embodiment.

FIG. 4 depicts a block diagram of an impedance matching circuit for a low frequency multi-band power amplifier, which outputs low frequency signals only.

The impedance matching circuit 400 shown in FIG. 4 has the same configuration as that of FIG. 3 except that the impedance matching circuit 400 outputs only low frequency signals and the output power reconfiguration network 350 of the path 311 is replaced with a frequency reconfiguration network 450 of the path 411.

Since the path 411 includes the frequency reconfiguration network 450, the path 411 may be allocated with, e.g., a UTMS BAND 8 signal as a principal band signal and a BAND 5 signal as an alternative band signal, which have a substantially same prescribed output power level but different center frequencies and frequency bands, and can selectively output one of them.

Since the path 416 includes the frequency reconfiguration network 455, the path 416 may be allocated, for example, with a GSM 900 signal as a principal band signal and a GSM 850 signal as an alternative band signal, which have a substantially same prescribed output power level but different center frequencies and frequency bands, and can selectively output one of them.

Figure 11A:
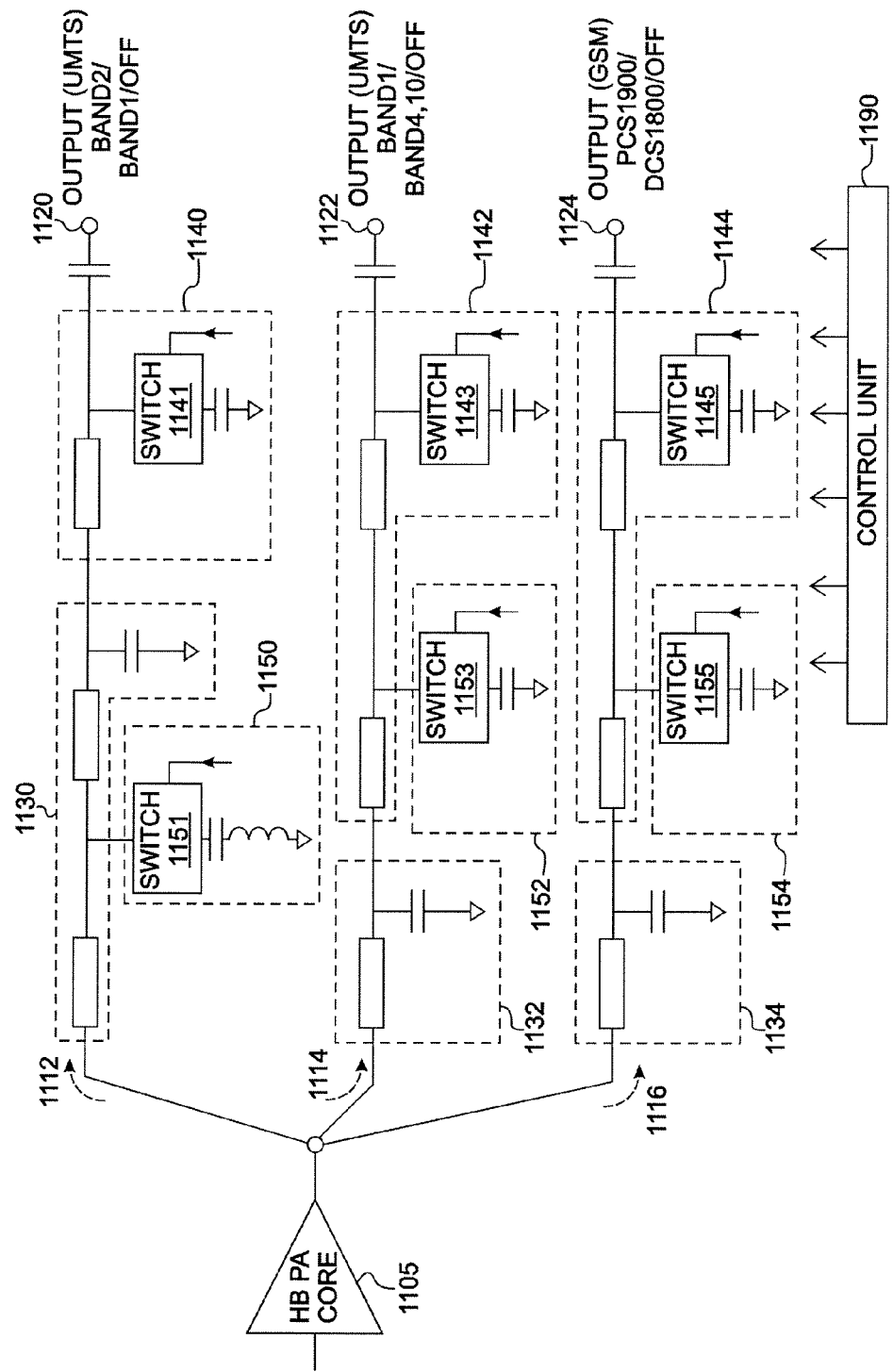
FIG. 11A depicts a circuit diagram of an impedance matching circuit capable of selectively activating one of three paths using a high frequency power amplifier core and selectively outputting one of a principal band signal and an alternative power level signal or an alternative band signal through one of output ports in accordance with a representative embodiment.

Each of the impedance matching circuits for a multi-band power amplifier shown in FIGS. 2 to 4 may have three or more output ports as illustrated in FIG. 1. As shown in FIG. 4 and FIG. 11A (which will be further described below), it is possible to implement a multi-mode power amplifier by causing a UMTS frequency band signal and a GSM-related signal to be selectively outputted through different output ports.

Furthermore, although each of the paths, shown in FIGS. 1, 3 and 4, is described as including either an output power reconfiguration network or a frequency reconfiguration network, the present teachings are not limited thereto. Each of the paths may include both an output power reconfiguration network and the frequency reconfiguration network, and may output four types of frequency band signals through a single output port. For example, when the path 416 of FIG. 4 further includes an output power reconfiguration network, not only GSM 900 and 850 signals may be selectively outputted by using the frequency reconfiguration network and but also an Enhanced Data for GSM Environment (EDGE) mode signal of GSM 900 or 850 signal, which requires a lower desired output power level than that of GSM 900 or 850 signal, may be outputted by using the output power reconfiguration network.

The detailed circuit configurations and operations of the fixed-value impedance matching network, output power reconfiguration network, frequency reconfiguration network and path on-off network which may constitute the impedance matching circuit of representative embodiments will be described below with reference to FIGS. 5 to 10.

Figure 5:
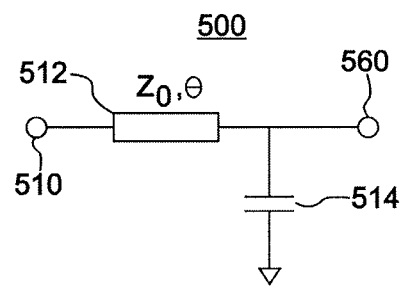
FIG. 5 depicts a circuit diagram of the fixed-value impedance matching network shown in FIG. 1, in accordance with representative embodiment.

FIG. 5 exemplifies a circuit diagram of the fixed-value impedance matching network shown in FIG. 1.

The fixed-value impedance matching network 500 includes a transmission line 512 (characteristic impedance=$Z_0$, and line length=$\theta$) configured to have ports 510, 560 at both sides as connection ports and a capacitor 514 with one end connected to the port 560 and the other end connected to ground. The port 510 of the transmission line 512 may be connected to the input port 110 of the impedance matching circuit 100 and the port 560 thereof may be connected to a path on-off network 140-1, 140-2, . . . , or 140-N. That is, the transmission line 512 connects the input port 110 and the path on-off network 140-1, 140-2, . . . , or 140-N in series. The characteristic impedance $Z_0$ and line length $\theta$ of the transmission line 512 and the capacitance of the capacitor 514 have fixed values, which are determined based on a value of the load impedance of the path employing the fixed-value impedance matching network of FIG. 5 and a target value of the input impedance thereof. The target value of the input impedance is chosen so as to enable the principal band signal of the relevant path to be outputted from the power amplifier core at a prescribed power level. It may be preferable to set the characteristic impedance $Z_0$ of the transmission line equal to a load impedance of the output port of the relevant path for the sake of design convenience.

Figure 6:
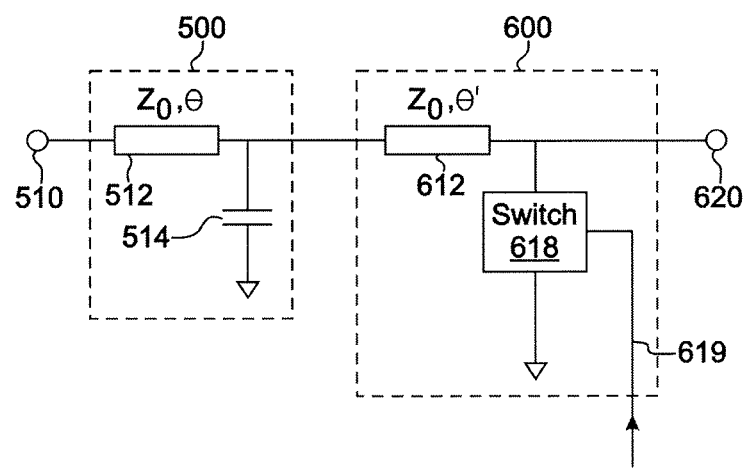
FIG. 6 depicts circuit diagrams of the fixed-value impedance matching networks and the path on-off networks shown in FIG. 1, in accordance with representative embodiments.

FIG. 6 provides exemplary circuit diagrams of the fixed-value impedance matching network and the path on-off network shown in FIG. 1.

A path on-off network 600 includes a series transmission line 612 (characteristic impedance=$Z_0$, and line length=$\theta'$) having a port (not shown) connected to the fixed-value impedance matching network 500 and a port 620 connected to an output port 120-1, 120-2, . . . , or 120-N and a Radio Frequency (RF) switch 618 with one end connected to the port 620 and the other end connected to ground. Meanwhile, a Direct Current (DC) block capacitor may be further connected between the switch 618 and ground to remove any DC component.

The RF switch 618 receives a control signal from the control unit 190 through a signal line 619. The RF switch 618 becomes open to activate the relevant path when a path-on signal is received, and closed to deactivate the relevant path when a path-off signal is received. When the path-off signal is received, the port 620 is short-circuited to ground so that the input impedance of the path has a high reactive impedance value with a very small resistance component. It may be preferable to set the characteristic impedance $Z_0$ of the transmission line equal to the load impedance of the output port of the relevant path for the sake of design convenience.

Figure 7:
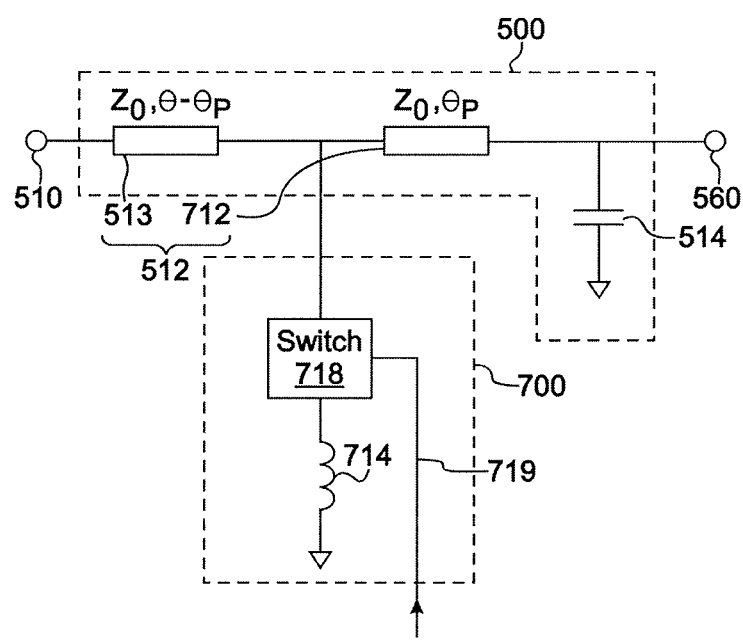
FIG. 7 depicts a circuit diagram of the fixed-value impedance matching network and the output power reconfiguration network shown in FIG. 3, in accordance with a representative embodiment.

FIG. 7 gives an exemplary circuit diagram of the fixed-value impedance matching network and the output power reconfiguration network shown in FIG. 3.

An output power reconfiguration network 700 may branch off from the transmission line 512 (characteristic impedance=$Z_0$, and line length=$\theta$) of the fixed-value impedance matching network 500 without providing an additional transmission line therefor, and be connected in parallel thereto. In particular, the output power reconfiguration network 700 may include a series combination of a RF switch 718 and an inductor 714, with one end thereof connected to a point away from the port 510 to a predetermined length $\theta$-$\theta p$ on the transmission line 512 and the other end thereof connected to ground. A series DC block capacitor may be inserted between the inductor 714 and the RF switch 718.

The RF switch 718 receives a signal from the control unit through a signal line 719. The RF switch 718 becomes closed when it receives an output conversion signal, and becomes open when it receives a default signal. If the principal band signal is desired to be outputted through a path, the control unit sends a default signal to the RF switch 718, and if the alternative power level signal is desired to be outputted therethrough, the control unit sends an output reconfiguration signal thereto.

Meanwhile, when the output power reconfiguration network 700 is included in a path, the transmission line 512 of the fixed-value impedance matching network 500 may be divided, at a point away from the terminal 510 to a predetermined length $\theta$-$\theta p$ on the transmission line 512, into a transmission line 513 (characteristic impedance=$Z_0$, and line length=$\theta$-$\theta p$) connected to the port 510 and a transmission line 712 (characteristic impedance=$Z_0$, and line length=$\theta p$) connected to the port 560.

Figure 8:
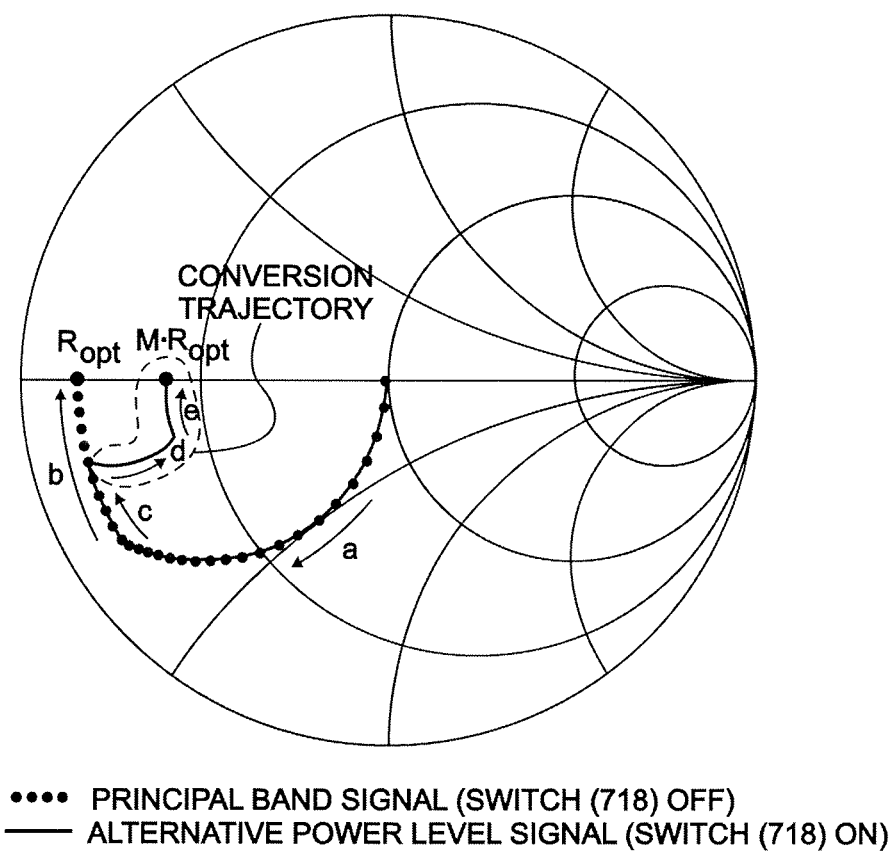
FIG. 8 depicts a Smith chart showing trajectories of a load to source impedance matching performed by the fixed-value impedance matching network and the output power reconfiguration network shown in FIG. 7.

FIG. 8 illustrates a Smith chart showing trajectories of a load to source impedance matching performed by the fixed-value impedance matching network and the output power reconfiguration network shown in FIG. 7.

Referring to FIGS. 3, 7 and 8, the operations of the circuit of FIG. 7 will be described in detail. First, for the sake of convenience, the characteristic impedances of the transmission lines 512, 612 of the fixed-value impedance matching network 500 and the path on-off network 600 are set equal to that of the load impedance of the output port of the path 511. Further, it is assumed that the value of the load impedance is 50 ohm and the RF switch 618 of the path on-off network 440 (or 600) of the path 511 is open, which activates the path 511.

When the RF switch 718 of the output power reconfiguration network 550 (or 700) is open, the principal band signal of the path 511 is sent through the path 511. Since there is neither an inductor nor a capacitor branching off in parallel from the transmission line 612 of the path on-off network 440 (or 600), the input impedance of the path 511 will not be changed by the transmission line 612 of the path on-off network 600. The value of the input impedance is converted from that of the load impedance along a curve 'a' by the parallel capacitor 514 of the fixed-value impedance matching network 500 and along a curve 'b' by the transmission line 512, and, therefore, the value of the input impedance of the path finally becomes a reference impedance R. This reference impedance $R_{opt}$ is a value which causes the power amplifier core to generate a fixed level of the output power for the principal band signal in order to meet the prescribed transmission power level of the principal band signal.

In contrast, when it is desired to send through the path 511 an alternative power level signal having a similar frequency band to that of the principal band signal and a different desired output power level from that of the principal band signal, the control unit 590 sends an output power conversion signal, and the RF switch 718 of the output power reconfiguration network 700 having received the output power conversion signal becomes closed. In this case, The input impedance is changed along a curve 'a' by the parallel capacitor 514, along a curve 'c' by the transmission line 712, along a curve 'd' by the inductor 714 and along a curve 'e' by the transmission line 513, and, therefore, the value of the input impedance of the path 511 finally becomes an alternative impedance $M \times R_{opt}$. This alternative impedance $M \times R_{opt}$ has a value which causes the power amplifier to generate the the alternative power level signal at the desired transmission power level thereof.

The predetermined length $\theta$-$\theta p$ of the transmission line 513 and the inductance of the inductor 714 shown in FIG. 7 are determined based on the alternative impedance $M \times R_{opt}$ of the alternative power level signal. The characteristic impedance value of the transmission line may be a value other than 50 ohm.

Figure 9:
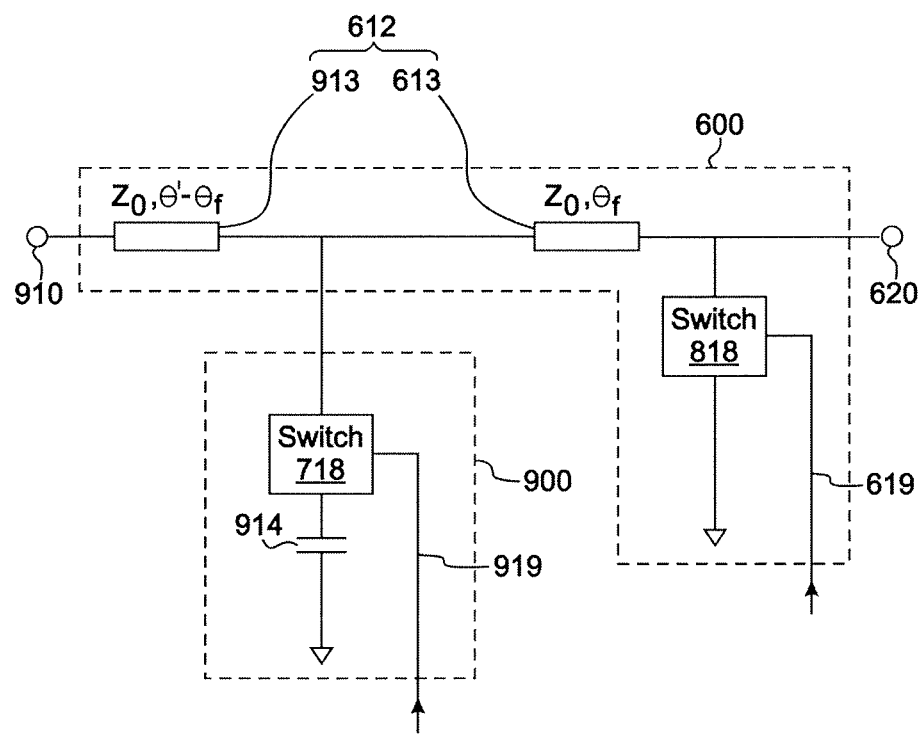
FIG. 9 depicts circuit diagrams of the frequency reconfiguration network and the path on-off network shown in FIG. 3, in accordance with representative embodiments.

FIG. 9 presents exemplary circuit diagrams of the frequency reconfiguration network and the path on-off network shown in FIG. 5.

The frequency reconfiguration network 900 may branch off from the transmission line 612 (characteristic impedance=$Z_0$ and line length=$\theta'$) of the path on-off network 600 and be connected in parallel thereto, without providing an additional transmission line. In particular, the frequency reconfiguration network 900 includes a series combination of a RF switch 918 and a capacitor 914, with one end connected to a point moved away from the port 620 to a predetermined length $\theta_f$ on the transmission line 612 and the other end connected to ground.

The RF switch 918 receives a signal from the control unit 590 through a signal line 919. The RF switch 918 becomes closed when it receives a frequency reconfiguration signal, and becomes open when it receives a default signal. If the principal band signal is desired to be outputted through the path, the control unit sends a default signal to the RF switch 718, and if the alternative band signal is desired to be outputted therethrough, the control unit sends the frequency reconfiguration signal thereto.

Meanwhile, when the frequency reconfiguration network 900 is included in a path, the transmission line 612 (characteristic impedance=$Z_0$, and line length=$\theta'$) may be divided, at a point moved away from the port 620 to a predetermined length $\theta_f$ on the transmission line 612, into a transmission line 613 (characteristic impedance=$Z_0$, and line length=$\theta_f$) connected to the port 620 and a transmission line 913 (characteristic impedance=$Z_0$, and line length=$\theta'$-$\theta_f$) connected to the port 910.

Figure 10:
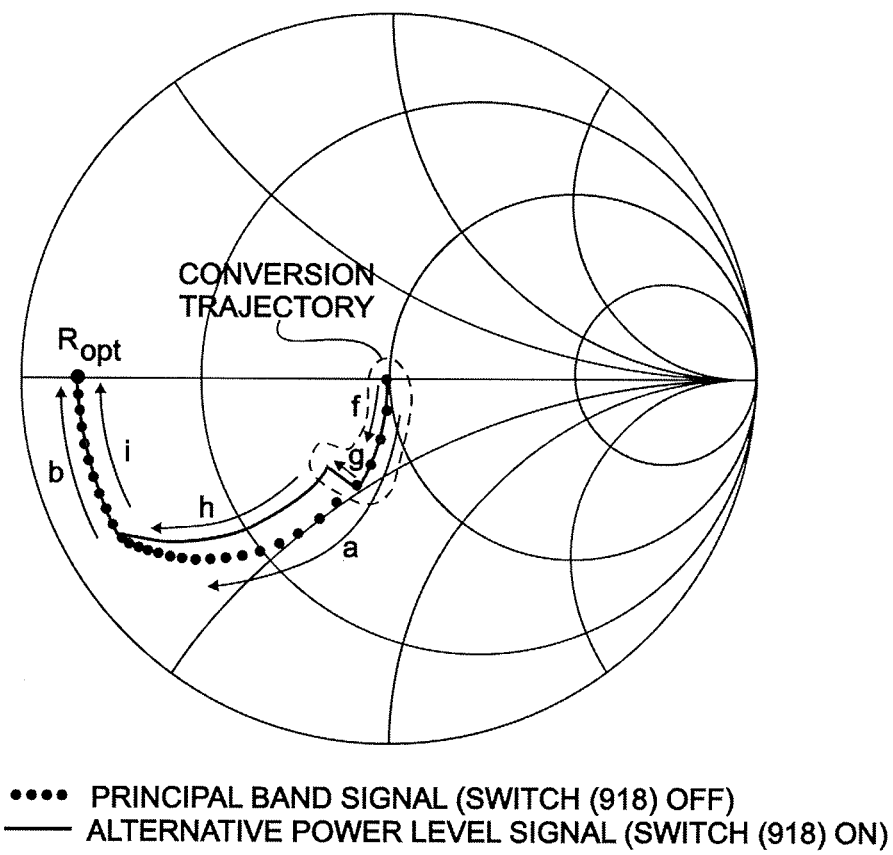
FIG. 10 depicts a Smith chart showing trajectories of a load to source impedance matching performed by the frequency reconfiguration network and the fixed-value impedance matching network in accordance with a representative embodiment.

FIG. 10 provides a Smith chart showing trajectories of a load to source impedance matching performed by the frequency reconfiguration network and the fixed-value impedance matching network.

Referring to FIGS. 3, 9 and 10, the operation of the circuit shown in FIG. 9 will be described in detail below. First of all, for the sake of convenience, the characteristic impedances of the transmission lines 612 and 512 of the path on-off network 900 and the fixed-value impedance matching network are set to a value equal to that of the load impedance of the output port of the path 316. Further, it is assumed that the value of the load impedance is 50 ohm and the RF switch 618 of the path on-off network 245 (or 600) of the path 316 is open.

The principal band signal of the path 316 is sent therethrough when the RF switch 918 of the frequency reconfiguration network 900 is open. When the principal band signal is transmitted through the path 316, the input impedance of the path 316 has a value of the reference impedance Ropt which causes the power amplifier core to generate the principal band signal at the prescribed transmission power level of the principal band signal. Since the detailed conversion trajectory is the same as curves 'a' and 'b' shown in FIG. 8, a detailed description thereof will not be repeated here.

However, when the alternative band signal which has the same desired output power level as the principal band signal but has a different frequency band from the principal band signal is desired to be sent through the path 316, the frequency characteristics of the path 316 must be changed. Accordingly, when it is desired to send the alternative band signal through the path, the control unit 390 sends a frequency reconfiguration signal. When the RF switch 918 of the frequency reconfiguration network 900 receives the frequency reconfiguration signal, the RF switch 918 of the frequency reconfiguration network 900 becomes closed. In this case, the value of the input impedance is changed along a curve by the parallel capacitor 914, along a curve g' by the transmission line 913, and along curves 'h' and 'i' by the fixed-value impedance matching network 230 or 435 shown in FIG. 3, and, therefore, the input impedance of the path finally becomes the reference impedance $R_{opt}$ with respect to the alternative band signal. Consequently, despite the frequency difference between the principal band signal and the alternative band signal, a same output power level can be obtained.

The predetermined length $\theta_f$ of the transmission line 613 and the capacitance of the capacitor 914 may be determined based on the frequency band of the alternative band signal. The characteristic impedance value of the transmission line may have a value other than 50 ohm.

The RF switches 618, 718, 918 used in accordance with representative embodiments may be PIN diode switches, High Electron Mobility Transistor (HEMT) switches, Radio Frequency Micro Electro Mechanical System (RF MEMS) switches and so on. Each of the switches may include a pair of connection ports and a terminal for receiving control signals from the control unit.

FIG. 11A offers a circuit diagram of an impedance matching circuit capable of selectively activating one of three paths using a high frequency power amplifier core and outputting one of multiple signals through a single output port.

A path 1112 includes a fixed-value impedance matching network 1130, an output power reconfiguration network 1150 and a path on-off network 1140, and outputs UMTS BAND 2 and BAND 1 signals as a principal band signal and an alternative power level signal thereof, respectively.

A path 1114 includes a fixed-value impedance matching network 1132, a frequency reconfiguration network 1152 and a path on-off network 1142, and outputs UMTS BAND 1 and BAND 4,10 signals as a principal band signal and an alternative band signal thereof, respectively.

A path 1116 includes a fixed-value impedance matching network 1134, a frequency reconfiguration network 1154 and a path on-off network 1144, and outputs GSM PCS 1900 and DCS 1800 signals as a principal band signal and an alternative band signal thereof, respectively.

Referring to FIG. 11A, the output power reconfiguration network 1150 is connected to a point of the transmission line of the fixed-value impedance matching network 1130, and each of the frequency reconfiguration networks 1152 and 1154 is connected to a point on the transmission line of the path on-off network 1142 or 1144. Using this configuration, it is possible to provide the output power reconfiguration network and the frequency reconfiguration network while minimizing the size of the circuit.

FIG. 11B tabulates the selected output ports and types of frequency band signals depending on the ON/OFF operations of the RF switches in the circuit shown in FIG. 11A.

Referring to this table, a frequency band signal is outputted through a path in which the switch 1141, 1143 or 1145 of the path on-off network is turned off. When the switch 1151, 1153 or 1155 of the reconfiguration network of the selected path is turned off, the principal band signal of the selected path is outputted. In contrast, when the switch 1151, 1153 or 1155 of the reconfiguration network of the selected path is turned on, the alternative power level signal or the alternative band signal of the path 1112, 1114 or 1116 is outputted.

As set forth above, the present teaching provide a number of benefits.

For example, the input impedances of idle paths can be rendered to have high reactive impedances with very small resistances. Needless to say, this makes it possible to achieve an isolation equal to or greater than 30 dB between an activated path and deactivated paths even if the paths are designed to transmit signals having slight frequency differences therebetween.

Further, in accordance with the present teachings, there is no need to provide a reconfiguration impedance matching circuit at input and interstage of a power amplifier core, depending on a type of input frequency band signals by limiting all transmission signals of the impedance matching circuit to high or low frequency signals.

In addition, by using the output power reconfiguration network and the frequency reconfiguration network of the present teachings, it is possible to selectively output one of multiple types of frequency signals through a single path and an output port, thereby reducing the number of idle output ports.

While representative embodiments are disclosed herein, one of ordinary skill in the art appreciates that many variations that are in accordance with the present teachings are possible and remain within the scope of the appended claims. The representative embodiments therefore are not to be restricted except within the scope of the appended claims.

What is claimed is:

1. An impedance matching circuit for use at an output stage of a power amplifier, the impedance matching circuit comprising:
    an input port for receiving a frequency band signal; and
    a plurality of paths, each path being allocated with a principal band signal to be transmitted therethrough and including a path on-off network and a fixed-value impedance matching network,
    wherein, depending on a type of the received frequency band signal, the path on-off network is configured to activate a selected one of the plurality of paths by rendering an input impedance of the selected path to have a lower absolute magnitude so that the signal is transmitted therethrough, and to deactivate the remaining paths of the plurality of paths by rendering the input impedance thereof to have a higher absolute magnitude so that the signal is not transmitted therethrough, and the fixed-value impedance matching network matches a load impedance of each path to the input impedance thereof, thereby rendering the input impedance thereof to have a prescribed reference value with respect to the principal band signal when said path is activated by the path on-off network.

2. The impedance matching circuit of claim 1, wherein an absolute magnitude of the input impedance of a deactivated path is at least ten times that of the input impedance of an activated path.

3. The impedance matching circuit of claim 1, wherein at least one of the plurality of paths further includes a frequency reconfiguration network adapted to transmit the principal band signal of the at least one path or an alternative band signal of the at least one path depending on the type of the received frequency band signal, the alternative band signal having a frequency band lower than a frequency band of the principal band signal of the at least one path and having a prescribed output power level substantially equal to that of the principal band signal of the at least one path, wherein, when the at least one path is activated by the path on-off network and the type of the received frequency band signal is the same as that of the alternative band signal, the fixed-value impedance matching network along with the frequency reconfiguration network renders the input impedance of the at least one path to have a value substantially equal to the prescribed reference value of the at least one path so that the received frequency band signal is transmitted therethrough at the prescribed output power level.

4. The impedance matching circuit of claim 1, wherein at least one of the paths further comprises an output power reconfiguration network adapted to selectively transmit the principal band signal of the at least one path or an alternative power level signal depending on the type of the received frequency band signal, the alternative power level signal having a frequency band substantially equal to that of the principal band signal of the at least one path and having a desired output power level lower than that of the principal band signal of the at least one path, wherein, when the at least one path is activated by the path on-off network and the type of the received frequency band signal is the same as that of the alternative power level signal, the fixed-value impedance matching network along with the output power reconfiguration network renders the input impedance of the at least one path to have a value greater than the prescribed reference value of the at least one path so that the received signal is transmitted therethrough at the desired output power level.

5. The impedance matching circuit of claim 1, wherein at least one of the paths further includes a frequency reconfiguration network and an output power reconfiguration network configured to selectively transmit the principal band signal of the at least one path, a first alternative signal, a second alternative signal or a third alternative signal, depending on the type of the received frequency band signal, the first alternative signal having a frequency band lower than that of the principal band signal and having a prescribed output power level substantially equal to that of the principal band signal of the at least one path, the second alternative signal having a frequency band substantially equal to that of the principal band signal of said at least one path and having a desired output power level lower than that of the principal band signal of the at least one path, the third alternative signal having the frequency band lower than that of the principal band signal of the at least one path and having the desired output power level lower than that of the principal band signal of the at least one path, wherein, when the at least one path is activated by the path on-off network and the type of the received frequency band signal is the same as that of the first alternative signal, the fixed-value impedance matching network along with the frequency reconfiguration network renders the input impedance of at least one path to have a value substantially equal to the prescribed reference value of the at least one path so that the received frequency band signal is transmitted therethrough at the prescribed output power level, when said at least one path is activated by the path on-off network and the type of the received frequency band signal is the same as that of the second alternative signal, the fixed-value impedance matching network along with the output power reconfiguration network renders the input impedance of the at least one path to have a value greater than the prescribed reference value of the at least one path so that the received signal is transmitted at the desired output power level, and when the at least one path is activated by the path on-off network and the type of the received frequency band signal is the same as that of the third alternative signal, the fixed-value impedance matching network along with the frequency reconfiguration network and the output power reconfiguration network renders the input impedance of the at least one path to have the value greater than the prescribed reference value of the at least one path so that the received signal is transmitted therethrough at the desired output power level.

6. The impedance matching circuit of claim 1, wherein the frequency band signal has a center frequency in a range of about 0.7 GHz to about 0.9 GHz.

7. The impedance matching circuit of claim 6, wherein a first path is allocated with a UMTS BAND 8 signal as the principal band signal and a second path is allocated with a GSM 900 signal as the principal band signal.

8. The impedance matching circuit of claim 1, wherein the fixed-value impedance matching network comprises a transmission line configured to connect the input port to the path on-off network and a capacitor with one end connected to the input port through the transmission line and another end connected to ground.

9. The impedance matching circuit of claim 8, wherein at least one of the paths further comprises an output power reconfiguration network configured to selectively transmit the principal band signal of the at least one path or an alternative power level signal depending on the type of the received frequency band signal, the alternative power level signal having a frequency band substantially equal to that of the principal band signal of the at least one path and having a desired output power level lower than that of the principal band signal of the at least one path, wherein, when the at least one path is activated by the path on-off network and the type of the received frequency band signal is the same as that of the alternative power level signal, the fixed-value impedance matching network along with the output power reconfiguration network renders the input impedance of the at least one path to have a value greater than the prescribed reference value of said at least one path so that the received signal is transmitted therethrough at the desired output power level.

10. The impedance matching circuit of claim 9, wherein the output power reconfiguration network comprises a series combination of a RF switch and an inductor, with one end of the RF switch connected to a point away from the input port to a predetermined length on the transmission line of the fixed-value impedance matching network and another end connected to ground.

11. The impedance matching circuit of claim 10, wherein the impedance matching circuit further comprises a control unit configured to open the RF switch if the type of the received signal is the same as that of the principal band signal of the at least one path and to close the RF switch if the type of the received signal is the same as that of the alternative power level signal.

12. The impedance matching circuit of claim 1, wherein the frequency band signal has a center frequency in a range of about 1.4 GHz to about 2.5 GHz.

13. The impedance matching circuit of claim 12, wherein a first path is allocated with a Universal Mobile Telecommunication System (UMTS) BAND 2 signal as the principal band signal and a second path is allocated with a UMTS BAND 1 signal as the principal band signal.

14. The impedance matching circuit of claim 12, wherein a first path is allocated with a UMTS BAND 2 signal as the principal band signal and a second path is allocated with a Global System for Mobile communication (GSM) PCS 1900 signal as the principal band signal.

15. The impedance matching circuit of claim 1, wherein the path on-off network of each of the plurality of paths comprises a transmission line configured to connect the fixed-value impedance matching network thereof to an output port of the respective path, and a radio frequency (RF) switch with one end thereof connected to the output port and the other end thereof connected to ground.

16. The impedance matching circuit of claim 15, wherein the impedance matching circuit further comprises a control unit configured to activate one of the paths by opening the RF switch of the one path and closing the RF switches of the remaining paths depending on the type of the received frequency band signal.

17. The impedance matching circuit of claim 15, wherein at least one of the paths further comprises a frequency reconfiguration network adapted to selectively transmit the principal band signal of the at least one path or an alternative band signal of the at least one path depending on the type of the received frequency band signal, the alternative band signal having a frequency band lower than that of the principal band signal of the at least one path and having a prescribed output power level substantially equal to that of the principal band signal of the at least one path, wherein, when the at least one path is activated by the path on-off network and the type of the received frequency band signal is the same as that of the alternative band signal, the fixed-value impedance matching network along with the frequency reconfiguration network renders the input impedance of the at least one path to have a value substantially equal to the prescribed reference value of said at least one path so that the received frequency band signal is transmitted therethrough at the prescribed output power level.

18. The impedance matching circuit of claim 17, wherein the frequency reconfiguration network comprises a series combination of a RF switch and a capacitor, with one end of the RF switch connected to a point away from the output port to a predetermined length on the transmission line of the path on-off network of the at least one path and another end thereof connected to ground.

19. The impedance matching circuit of claim 18, wherein the impedance matching circuit further comprises a control unit adapted to open the RF switch of the frequency reconfiguration network if the type of the received signal is the same as that of the principal band signal of the at least one path and closing the RF switch of the frequency reconfiguration network if the type of the received signal is the same as that of the alternative band signal thereof.

20. An impedance matching circuit for use at an output stage of a power amplifier, the impedance matching circuit comprising:
an input port configured to receive a frequency band signal; and
a path, comprising a fixed-value impedance matching network and a frequency reconfiguration network, and configured to selectively transmit a principal band signal or an alternative band signal depending on a type of the received frequency band signal, the alternative band signal having a frequency band lower than that of the principal band signal and having a prescribed output power level substantially equal to that of the principal band signal,
wherein, when the type of the received frequency band signal is the substantially same as that of the principal band signal, the fixed-value impedance matching network matches a load impedance of the path to an input impedance of the path, thereby rendering the input impedance to have a prescribed reference value, and, when the type of the received frequency band signal is substantially the same as that of the alternative band signal, the fixed-value impedance matching network along with the frequency reconfiguration network renders the input impedance to have a value substantially equal to the prescribed reference value so that the received signal is transmitted therethrough at the prescribed output power level.

21. An impedance matching circuit for use at an output stage of a power amplifier, the impedance matching circuit comprising:
an input port configured to receive a frequency band signal; and
a path, comprising a fixed-value impedance matching network and an output power reconfiguration network, and configured to selectively transmit a principal band signal or an alternative power level signal depending on a type of the received frequency band signal, the alternative power level signal having a frequency band substantially equal to that of the principal band signal and having an output power level lower than that of the principal band signal,
wherein, when the type of the received frequency band signal is substantially the same as that of the principal band signal, the fixed-value impedance matching network matches a load impedance of the path to an input impedance of the path, thereby rendering the input impedance to have a prescribed reference value, and, when the type of the received frequency band signal is substantially the same as that of the alternative power level signal, the fixed-value impedance matching network along with the output power reconfiguration network renders the input impedance to have a value greater than the prescribed reference value so that the received signal is transmitted therethrough at the desired output power level.

* * * * *